United States Patent
Pagano et al.

(10) Patent No.: US 8,390,366 B2
(45) Date of Patent: Mar. 5, 2013

(54) CHARGE PUMP STAGE, METHOD FOR CONTROLLING A CHARGE PUMP STAGE AND MEMORY HAVING A CHARGE PUMP STAGE

(75) Inventors: Santi Nunzio Antonino Pagano, Catania (IT); Francesco La Rosa, Rousset (FR); Alfredo Signorello, Tremestieri Etneo (IT)

(73) Assignees: STMicroelectronics (Rousset) SAS, Rousset (FR); STMicroelectronics S.r.l., Agrate Brianza (IT)

( * ) Notice: Subject to any disclaimer, the term of this patent is extended or adjusted under 35 U.S.C. 154(b) by 58 days.

(21) Appl. No.: 12/955,809

(22) Filed: Nov. 29, 2010

(65) Prior Publication Data

US 2011/0128070 A1 Jun. 2, 2011

(30) Foreign Application Priority Data

Nov. 30, 2009 (IT) ............................... TO2009A0937

(51) Int. Cl.
*G05F 1/10* (2006.01)
(52) U.S. Cl. ...................................................... 327/536
(58) Field of Classification Search .................. None
See application file for complete search history.

(56) References Cited

U.S. PATENT DOCUMENTS

| | | | |
|---|---|---|---|
| 5,701,105 A * | 12/1997 | Park | .............................. 331/153 |
| 5,883,501 A | 3/1999 | Arakawa | |
| 6,107,862 A | 8/2000 | Mukainakano et al. | |
| 6,534,963 B2 | 3/2003 | Bayer et al. | |
| 6,812,747 B2 | 11/2004 | Ganivet et al. | |
| 7,372,259 B1 * | 5/2008 | Crist | .............................. 324/244 |
| 7,827,427 B2 | 11/2010 | Lee et al. | |
| 8,120,411 B1 * | 2/2012 | Liu et al. | ........................ 327/536 |
| 2003/0112056 A1 | 6/2003 | Tanzawa et al. | |

FOREIGN PATENT DOCUMENTS

WO 2007/082756 A1 7/2007

* cited by examiner

*Primary Examiner* — Lincoln Donovan
*Assistant Examiner* — Sibin Chen
(74) *Attorney, Agent, or Firm* — Seed IP Law Group PLLC (57) ABSTRACT

A charge pump having a supply terminal, for receiving a supply voltage, and an output terminal, for supplying an output voltage. The charge pump has a control block including a comparator having a first comparison input, for receiving the supply voltage, a second comparison input, for receiving the output voltage, and a comparison output, for generating a pump-switch-off signal depending upon a comparison between the input voltage and the output voltage; and a switch controlled in switching off by the pump-switch-off signal and configured for switching off the charge pump circuit. The control block has an activation input for receiving an activation signal that has a plurality of pulses and repeatedly activates the comparator-circuit block.

35 Claims, 8 Drawing Sheets

Fig.1

PRIOR ART

Fig.2

PRIOR ART

CHARGE PUMP STAGE, METHOD FOR CONTROLLING A CHARGE PUMP STAGE AND MEMORY HAVING A CHARGE PUMP STAGE

BACKGROUND

1. Technical Field

The present disclosure relates to a charge pump stage, a method for controlling the charge pump stage, and a memory comprising the charge pump stage, such as a charge pump stage with reduced consumption and to a method for controlling supply of the charge pump stage.

2. Description of the Related Art

As is known, charge pumps are typically used in circuits that have internal operating voltages higher than a supply voltage $V_{DD}$. For instance, in the case of circuits that manage nonvolatile memory cells of an EEPROM type, the supply voltage of the circuits responsible for reading said cells are generally comprised in the range of 2.2-4.5 V. In the case of memory cells of a FLASH type, the range of supply voltage is approximately 4-6 V. The programming and erasure voltages are approximately 12-15 V, whilst the supply voltage $V_{DD}$ is generally comprised between 1 V and 4 V. Operation of a charge pump is based upon the charge transfer from a supply terminal (biased at the supply voltage) to an output stage of the charge pump, which comprises an accumulation capacitor configured for accumulating a charge such as to generate across it the desired output voltage $V_{OUT}$. Said output voltage depends upon the charge transferred. In order to regulate automatically the amount of current supplied to the accumulation capacitor to keep the voltage $V_{OUT}$ across it relatively constant, it is common to use a voltage-regulator circuit configured for detecting the voltage $V_{OUT}$ at output from the charge pump (or, more typically, a voltage proportional to the output voltage) and control in feedback the current supplied to the accumulation capacitor in order to maintain the output voltage $V_{OUT}$ at a desired regulation value $V_{REG}$.

Operation of a regulator circuit generally envisages comparison of a partition of the output voltage $V_{OUT}$ with a reference voltage $V_{REF}$ (generated by means of a bandgap circuit of a known type). The result of said comparison is a state signal, which indicates that a desired level of output voltage $V_{OUT}$ has been reached and is configured for acting on the charge pump for interrupting charge transfer to the accumulation capacitor.

Figure 1:
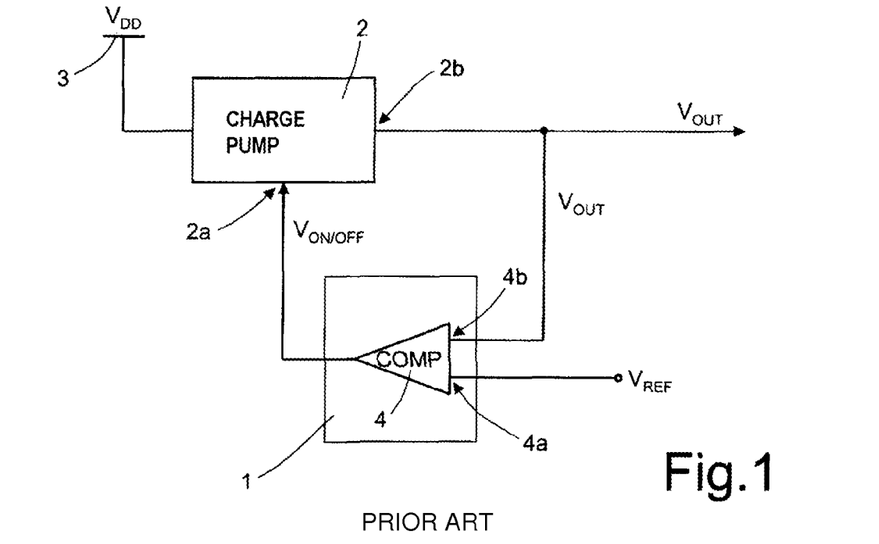
FIG. 1 shows a charge pump circuit of a known type.

FIG. 1 shows a regulator circuit 1, of a known type, configured for generating at output a signal for enabling charge transfer $V_{ON/OFF}$ and connected to a charge pump 2, which is also of a known type, which is connected to a supply terminal 3, from which it receives the supply voltage $V_{DD}$, and is configured for receiving on an input terminal 2a the signal for enabling charge transfer $V_{ON/OFF}$ and generating a charge signal $V_{OUT}$ on an output terminal 2b. According to an embodiment of a known type, the regulator circuit 1 comprises a comparator 4, configured for receiving on a first input 4a a reference signal $V_{REF}$ and on a second input 4b the output signal $V_{OUT}$ (or, typically, a comparison signal, not shown, given by a partition of the output signal $V_{OUT}$), and for generating at output the signal for enabling charge transfer $V_{ON/OFF}$ on the basis of the comparison between the partition of the output signal $V_{OUT}$ and the reference signal $V_{REF}$.

BRIEF SUMMARY

This disclosure is generally directed to a charge pump stage, a method for controlling the charge pump stage, and a memory comprising the charge pump stage.

In an embodiment, a charge pump stage comprises: a charge pump circuit having a supply terminal configured for receiving a supply voltage, and an output terminal configured for supplying an output voltage; a control block, comprising a comparator circuit having a first comparison input configured for receiving a first voltage correlated to the supply voltage, a second comparison input configured for receiving a second voltage correlated to the output voltage, and a comparison output configured for generating a pump-switch-off signal depending upon a comparison between the first voltage and the second voltage; and pump-switch-off means receiving the pump-switch-off signal and configured for switching off the charge pump circuit, said charge pump stage being characterized in that the control block comprises an activation input configured for receiving an activation signal having a plurality of pulses and repeatedly activating said comparator circuit. In an embodiment, the control block further comprises an activation-signal generator, configured for receiving at input a clock signal and, on the basis of a timing defined by said clock signal, output the activation signal. In an embodiment, the comparator circuit has a supply input, and the control block further comprises a supply circuit, the supply circuit being connected to the supply input and being configured for receiving the activation signal and, on the basis of the activation signal received, supplying the comparator circuit in a discontinuous way. In an embodiment, the supply circuit comprises a control switch having a first conduction terminal connected to the supply input and a second conduction terminal connected to a reference potential terminal, said control switch being controlled alternatively in a ON state and in a OFF state by means of the activation signal, for connecting and disconnecting alternatively the supply input to/from the reference potential terminal. In an embodiment, the activation signal is of a periodic digital type having a first logic value in a first time interval in which the control switch is in an ON state, and a second logic value in a second time interval in which the control switch is in an OFF state, the second time interval being chosen as having a duration such as to maintain the comparator circuit in an ON state. In an embodiment, the activation signal has a duty-cycle of less than 50%. In an embodiment, the activation signal has a duty-cycle comprised between 1% and 10%. In an embodiment, the supply circuit further comprises a biasing transistor, connected between the first conduction terminal of the control switch and the supply input and configured for generating a biasing current. In an embodiment, the control block further comprises a current mirror having a first input terminal and a second input terminal and a first output terminal and a second output terminal, the first input terminal of the current mirror being connected to the supply terminal of the charge pump circuit, the second input terminal of the current mirror being connected to the output terminal of the charge pump circuit, and one between the first and second output terminals of the current mirror being connected to the comparison output. In an embodiment, the current mirror comprises a first transistor and a second transistor having a respective first conduction terminal, a respective second conduction terminal, and a respective control terminal, said first conduction terminals forming, respectively, the first comparison input and the second comparison input of the control block, said control terminals of the first and second transistors being connected to one another and being moreover connected to the second conduction terminal of one between the first and second transistors; said control block further comprising a first current source, connected to the second conduction terminal of the first transistor, and a second current source, connected to the conduction terminal of the second transistor, said supply circuit being connected to the first output terminal of the current mirror via the first current source and to the second output terminal of the current mirror via the second current source. In an embodiment, the switch-off means comprise a bypass switch, having a first conduction terminal connected to the supply terminal, a second conduction terminal connected to the output terminal and a control terminal connected to the comparison output and configured for receiving the pump-switch-off signal. In an embodiment, a memory comprises charge pump stage as described herein.

In an embodiment, a method for controlling a charge pump stage, comprising the steps of: receiving, by a charge pump circuit, a supply voltage; generating, by the charge pump circuit, an output voltage; receiving, by a control block, a first voltage correlated to the supply voltage and a second voltage correlated to the output voltage; and generating, by the control block, a pump-switch-off signal depending upon a comparison between the first voltage and the second voltage; said method being characterized by the step of: repeatedly activating the control block by means of an activation signal having a plurality of pulses. In an embodiment, the control block comprises a comparator circuit configured for comparing the first voltage and the second voltage with one another and, on the basis of said comparison, generating the pump-switch-off signal, and wherein the step of repeatedly activating the control block comprises supplying the comparator circuit in a discontinuous way. In an embodiment, the activation signal has, during a first time interval, a first logic value for supply of the comparator circuit and, during a second time interval, a second logic value for supply interruption of the comparator circuit. In an embodiment, the activation signal has a duty-cycle of less than 50%. In an embodiment, the activation signal has a duty-cycle comprised between 1% and 10%.

In an embodiment, a charge pump comprises: a supply terminal configured to receive a supply voltage and an output terminal configured to supply an output voltage; a control block, including: a comparator having a first comparison input configured to receive a first voltage correlated to the supply voltage, a second comparison input configured to receive a second voltage correlated to the output voltage, and a comparison output configured to generate a pump-switch-off signal based on a comparison between the first voltage and the second voltage; and a duty-cycle block configured to periodically activate the comparator during operation of the control block based on a plurality of pulses; and a switch configured to switch off the charge pump based on the pump-switch-off signal. In an embodiment, the control block further comprises an activation-signal generator, configured to receive a clock signal and to generate the plurality of pulses based on the clock signal. In an embodiment, the comparator has a supply input, and the duty-cycle block has a current generator coupled to the supply input and configured to receive the plurality of pulses and based the received plurality of pulses, to supply the comparator in a discontinuous way. In an embodiment, the current generator comprises a control switch having a first conduction terminal coupled to the supply input and a second conduction terminal coupled to a reference potential terminal, the control switch being configured to operate alternatively in a ON state and in a OFF state in response to the plurality of pulses. In an embodiment, the plurality of pulses are a signal of a periodic digital type having a first logic value in a first time interval in which the control switch is in an ON state, and a second logic value in a second time interval in which the control switch is in an OFF state. In an embodiment, the duty-cycle block is configured to maintain a duty-cycle of the comparator of less than 50%. In an embodiment, the duty-cycle block is configured to maintain a duty-cycle of the comparator of between 1% and 10%. In an embodiment, the current generator comprises a biasing transistor, coupled between a first conduction terminal of a control switch and the supply input and configured to generate a biasing current. In an embodiment, the control block comprises a current mirror having a first input and a second input, and a first output, the first input of the current mirror being coupled to the supply terminal, the second input of the current mirror being coupled to the output terminal, and the first output of the current mirror being coupled to the comparison output. In an embodiment, the current mirror comprises a first transistor and a second transistor having a respective first conduction terminal, a respective second conduction terminal, and a respective control terminal, said first conduction terminals forming, respectively, the first comparison input and the second comparison input of the control block, said control terminals of the first and second transistors being coupled to one another and to the second conduction terminal of one between the first and second transistors, wherein said control block comprises a first current source coupled to the second conduction terminal of the first transistor, and a second current source coupled to the conduction terminal of the second transistor, said current generator being coupled to the first output of the current mirror via the first current source and to a second output of the current mirror via the second current source. In an embodiment, the switch is a bypass switch, having a first conduction terminal coupled to the supply terminal, a second conduction terminal coupled to the output terminal and a control terminal coupled to the comparison output and configured to receive the pump-switch-off signal.

In an embodiment, a memory comprises: a memory block; and a charge pump, the charge pump being configured to provide an output voltage to the memory block and including: a comparator configured to compare a first voltage correlated to a supply voltage to a second voltage correlated to the output voltage; and a duty-cycle block configured to periodically activate the comparator during operation of the memory block based on a plurality of pulses. In an embodiment, the charge pump further comprises an activation-signal generator configured to receive a clock signal and to generate the plurality of pulses based on the clock signal. In an embodiment, the plurality of pulses are a signal of a periodic digital type having a first logic value in a first time interval and a second logic value in a second time interval. In an embodiment, the duty-cycle block is configured to maintain a duty-cycle of the comparator of between 1% and 10%. In an embodiment, the duty-cycle block comprises a current generator coupled between a first conduction terminal of a control switch and a supply input of the comparator and configured to generate a biasing current. In an embodiment, the comparator comprises a current mirror having a first input and a second input, and a first output, the first input of the current mirror being coupled to the supply voltage, the second input of the current mirror being coupled to the output voltage, and the first output of the current mirror being coupled to an output of the comparator. In an embodiment, the charge pump comprises a bypass switch coupled between the supply voltage and an output of the charge pump, wherein the comparator is configured to control the bypass switch.

In an embodiment, a method comprises: providing a supply voltage to a charge pump configured to provide an output voltage; in response to a plurality of pulses, periodically comparing a first voltage correlated to the supply voltage to a second voltage correlated to the output voltage of the charge pump; and generating a charge-pump control signal based on the comparing. In an embodiment, the periodically comparing comprises supplying a comparator in a discontinuous way. In an embodiment, the plurality of pulses are pulses of an activation signal having, during a first time interval, a first logic value for supply of the comparator and, during a second time interval, a second logic value for supply interruption of the comparator. In an embodiment, the activation signal has a duty-cycle of less than 50%. In an embodiment, the activation signal has a duty-cycle between 1% and 10%. In an embodiment, the method comprises providing a biasing current to a comparator, wherein the periodically comparing comprises interrupting the biasing current in response to the plurality of pulses. In an embodiment, the method further comprises generating the plurality of pulses.

In an embodiment, a system comprises: means for generating an output voltage from a supply voltage; means for responding to a plurality of pulses by periodically comparing a first voltage correlated to the supply voltage to a second voltage correlated to the output voltage; and means for controlling the means for generating coupled to the means for periodically comparing, wherein the controlling is based on the periodic comparing. In an embodiment, the system further comprises: means for storing data coupled to the means for generating. In an embodiment, the system comprises means for providing a biasing current to the means for periodically comparing, wherein the means for providing a biasing current is configured to periodically supply the biasing current based on the plurality of pulses. In an embodiment, the system further comprises means for generating the plurality of pulses.

BRIEF DESCRIPTION OF THE SEVERAL VIEWS OF THE DRAWINGS

For a better understanding of the present disclosure, example embodiments are now described, purely by way of non-limiting example, with reference to the attached drawings, wherein:

FIG. 8 shows a circuit for generation of the digital signal of FIG. 7b starting from the clock signal of FIG. 7a;

FIGS. 9a-9g show intermediate signals of the generation circuit of FIG. 8 for the purposes of generation of the digital signal of FIG. 7b;

DETAILED DESCRIPTION

In the following description, certain details are set forth in order to provide a thorough understanding of various embodiments of devices, methods and articles. However, one of skill in the art will understand that other embodiments may be practiced without these details. In other instances, well-known structures and methods associated with, for example, memories, charge pumps, current mirrors, current generators, etc., have not been shown or described in detail in some figures to avoid unnecessarily obscuring descriptions of the embodiments.

Unless the context requires otherwise, throughout the specification and claims which follow, the word "comprise" and variations thereof, such as "comprising," and "comprises," are to be construed in an open, inclusive sense, that is, as "including, but not limited to."

Reference throughout this specification to "one embodiment," or "an embodiment" means that a particular feature, structure or characteristic described in connection with the embodiment is included in at least one embodiment. Thus, the appearances of the phrases "in one embodiment," or "in an embodiment" in various places throughout this specification are not necessarily referring to the same embodiment, or to all embodiments. Furthermore, the particular features, structures, or characteristics may be combined in any suitable manner in one or more embodiments to obtain further embodiments.

The headings are provided for convenience only, and do not interpret the scope or meaning of this disclosure or the claims.

The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not necessarily intended to convey any information regarding the actual shape of particular elements, and have been selected solely for ease of recognition in the drawings. Geometric references are not intended to refer to ideal embodiments. For example, a rectilinear-shaped feature or element does not mean that a feature or element has a geometrically perfect rectilinear shape.

Charge pumps of a known type present, during operation, a relatively high current consumption, which does not render them optimal in battery systems or in any case in low-power systems. In particular, the applicant has found that, in circuits of the type shown in FIG. 1, the supply voltage $V_{DD}$ can assume both a value higher and a value lower than the output voltage $V_{OUT}$. For example, in battery-supplied systems, the supply voltage $V_{DD}$ can have a high value (and in particular higher than the output voltage $V_{OUT}$) when the battery is fully charged, whereas it can drop below the output voltage $V_{OUT}$ when the battery is run down. Both in the former situation and in the latter situation, the charge pump continues to operate even if, in effect, in the first situation ($V_{DD} > V_{OUT}$) its operation is useless. In fact, the charge pump, supplied by the supply voltage $V_{DD}$, generates at output an output voltage $V_{OUT}$ (defined by the value chosen for the regulation voltage $V_{REG}$) of a value equal to or lower than the supply voltage $V_{DD}$, causing a current consumption not necessary for operation of the system including said charge pump.

Figure 2:
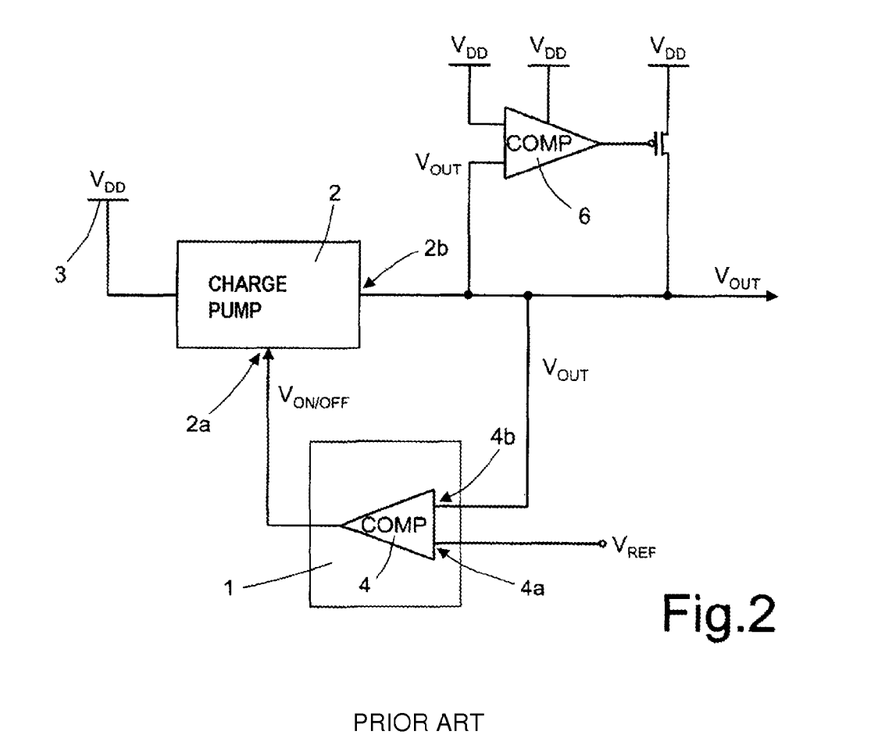
FIG. 2 shows a charge pump circuit with limited consumption according to an embodiment of a known type.

A possible solution to this problem is provided in the U.S. Pat. No. 6,812,747. This solution, as shown in FIG. 2, envisages the use of a second voltage comparator 6, supplied by the supply voltage $V_{DD}$ and configured for taking the supply voltage $V_{DD}$ of the charge pump 2 and the output voltage $V_{OUT}$ supplied at output from the charge pump 2 for comparing them and driving, via an output signal thereof, conduction or inhibition of a pMOS transistor. The charge pump 2 is driven in operation when necessary, i.e., when the output voltage $V_{OUT}$ is higher than the supply voltage $V_{DD}$ (in this case the pMOS transistor is driven in inhibition). In the opposite case, instead, the output voltage $V_{OUT}$ is taken directly from the supply terminal 3, so that $V_{OUT}=V_{DD}$ (in this case the pMOS transistor is driven in conduction).

Said solution, albeit limiting the levels of consumption of the charge pump 2, the introduction of the second voltage comparator 6 generates a further source of energy consumption.

Figure 3:
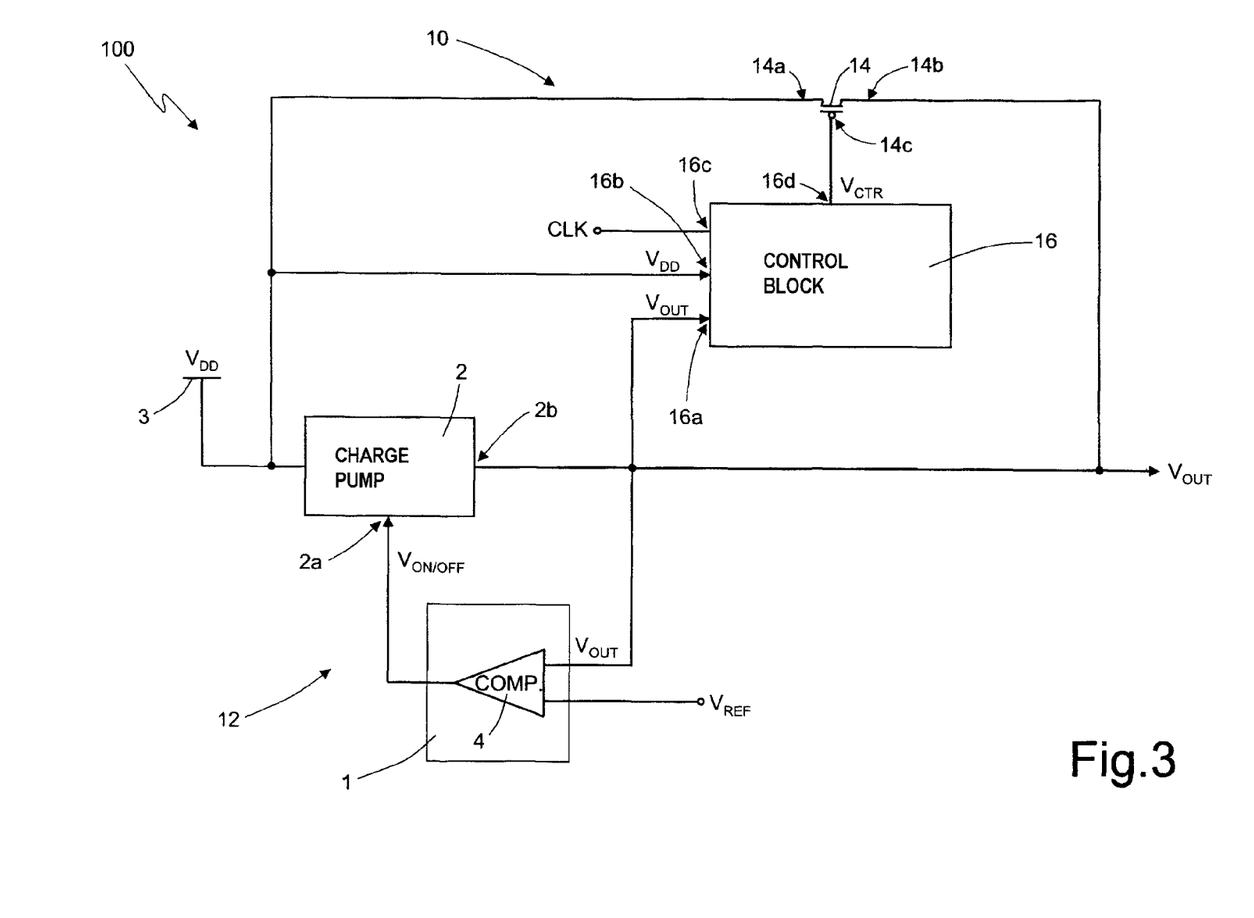
FIG. 3 shows a charge pump stage with current consumption optimized according to an embodiment.

FIG. 3 shows, via a block diagram, a charge pump stage 100, comprising a system for management of the supply 10 for a charge pump circuit 12 including a charge pump 2 of a known type, according to one embodiment. Elements of the charge pump circuit 12 already described with reference to FIGS. 1 and 2 are designated by the same reference numbers.

The supply-management system 10 comprises a switch 14, for example a MOSFET (a pMOS transistor is shown in the figure) having a first conduction terminal 14a coupled to the supply terminal 3 and a second supply terminal 14b coupled to the output terminal 2b of the charge pump 2. The switch 14 moreover has a control terminal 14c, via which the switch 14 itself is driven alternatively in conduction or inhibition. The switch 14, when driven in conduction, sets up an electrical connection between the supply terminal 3 and output terminal 2b of the charge pump 2.

The supply-management system 10 further comprises a control block 16 configured to drive the switch 14 in conduction and inhibition. The control block 16 possesses: a first input terminal 16a coupled to the output terminal 2b of the charge pump 2 and configured to receive the output voltage $V_{OUT}$; a second input terminal 16b, coupled to the supply terminal 3 and configured to receive the supply voltage $V_{DD}$; a third input terminal 16c, configured to receive a clock signal CLK (for example, of the type shown in FIG. 7a); and an output terminal 16d, coupled to the control terminal 14c of the switch 14 and configured to supply to the switch 14 a control signal $V_{CTR}$ for activating the switch 14 in conduction or inhibition.

In use, the control block 16, receiving at input the output voltage $V_{OUT}$ and the supply voltage $V_{DD}$, carries out an operation of comparison between the output voltage $V_{OUT}$ and the supply voltage $V_{DD}$ and, in the case where the supply voltage $V_{DD}$ is equal to or higher than the output voltage $V_{OUT}$, controls the switch 14 in conduction, in effect connecting the supply terminal 3 with the output terminal 2b of the charge pump 2. In this way, the output terminal 2b of the charge pump 2 is biased at the supply voltage $V_{DD}$, and the output voltage $V_{OUT}$ assumes the value of the supply voltage $V_{DD}$. In addition, since the charge pump 2 is, in effect, short-circuited, it is automatically de-activated and turns off.

Instead, in the case where the supply voltage $V_{DD}$ is lower than the output voltage $V_{OUT}$, the control block 16 controls the switch 14 in inhibition, interrupting the connection between the supply terminal 3 and the output terminal 2b of the charge pump 2. In this situation, the charge pump 2 operates according to its normal operating modality.

The connection that is set up between the supply terminal 3 and the output 2b of the charge pump 2 when the switch 14 is in conduction forms a preferential path for the supply current. The charge pump 2, without the supply, turns off automatically, without the need for any switch-on/switch-off signals generated externally. At the same time, when the supply voltage $V_{DD}$ drops below the value of the regulation voltage $V_{REG}$ (the value of the regulation voltage $V_{REG}$ is in this case defined by the voltage value that is set up across the accumulation generator of the charge pump 2, present on an output stage of the charge pump), the control block 16 drives the switch 14 in inhibition. The charge pump 2 is then again supplied by the supply voltage $V_{DD}$ and returns automatically into an operative state, supplying the desired output voltage $V_{OUT}$ on its output 2b.

Figure 4:
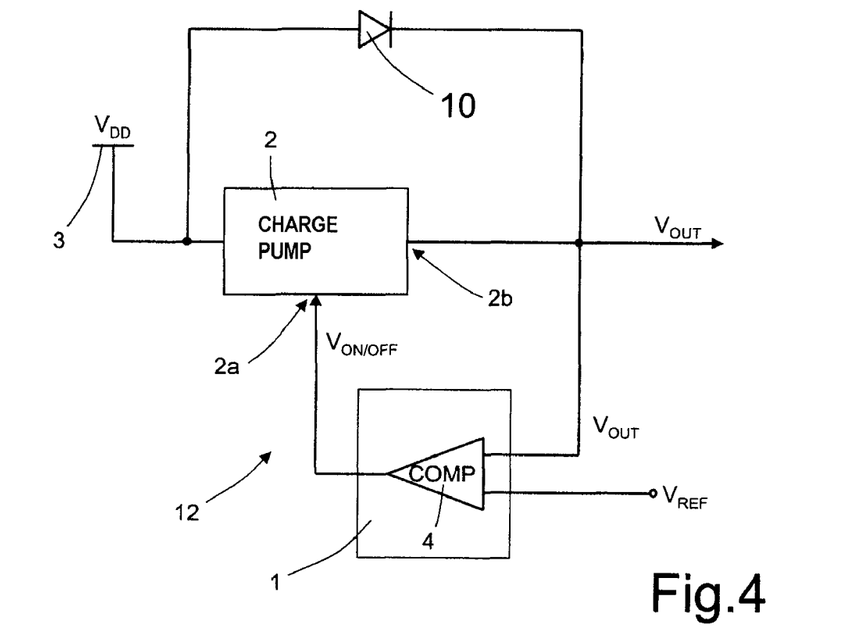
FIG. 4 shows, in a schematic form, a circuit representation of the charge pump stage of FIG. 3.

In use, the supply-management system 10 operates in effect as an ideal diode, i.e., without a voltage drop due to the presence of a threshold voltage, connected in parallel to the charge pump 2, as shown schematically in FIG. 4.

Figure 5A:
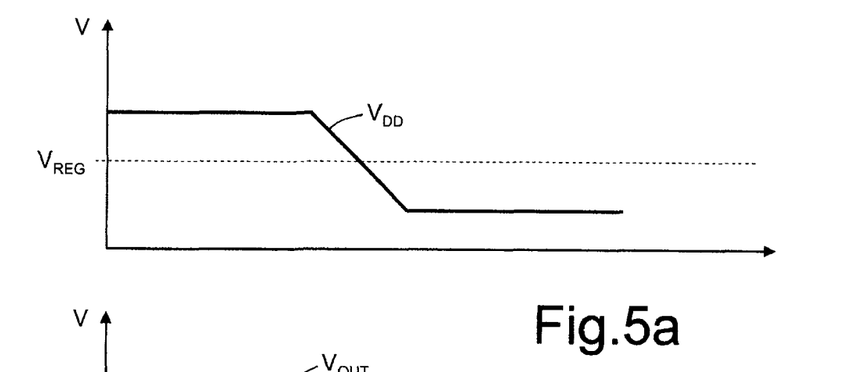
FIGS. 5a and 5b show, respectively, voltage curves that represent operation of the charge pump stage of FIG. 3.
Figure 5B:
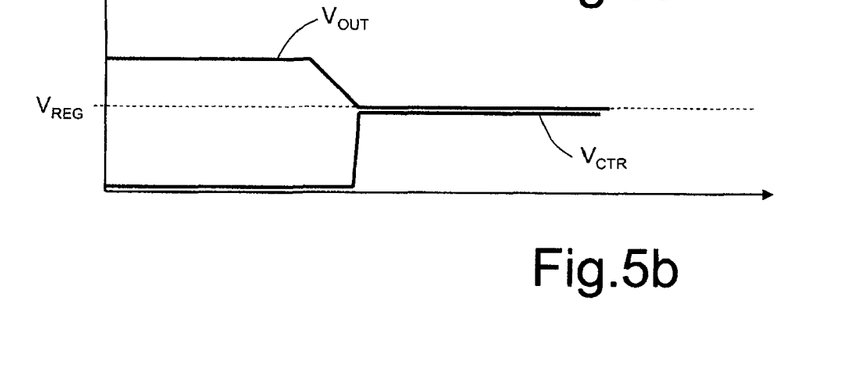

Operation of the circuit of FIGS. 3 and 4 is illustrated in FIGS. 5a and 5b, which show, respectively, the plot of the supply voltage $V_{DD}$ and of the output voltage $V_{OUT}$. When the supply voltage $V_{DD}$ is higher than the regulation voltage $V_{REG}$ (i.e., higher than the output voltage $V_{OUT}$, regulated at the value of the regulation voltage $V_{REG}$ via the regulator circuit 1), the control block 16 drives the switch 14 in conduction, consequently depriving the charge pump 2 of the supply voltage and causing switching-off thereof. Consequently, the output voltage $V_{OUT}$ assumes a value substantially equal to the value of the supply voltage $V_{DD}$. In this operating step, the charge pump does not consume any current.

If the value of the supply voltage $V_{DD}$ drops below the regulation voltage $V_{REG}$ (i.e., below the voltage that is set up across the accumulation generator of the charge pump 2), the control block 16 drives the switch 14 in inhibition. The charge pump 2 is again supplied and resumes its normal operation, generating on the output 2b an output voltage $V_{OUT}$ regulated at the value of the regulation voltage $V_{REG}$ via the regulator circuit 1.

Figure 6:
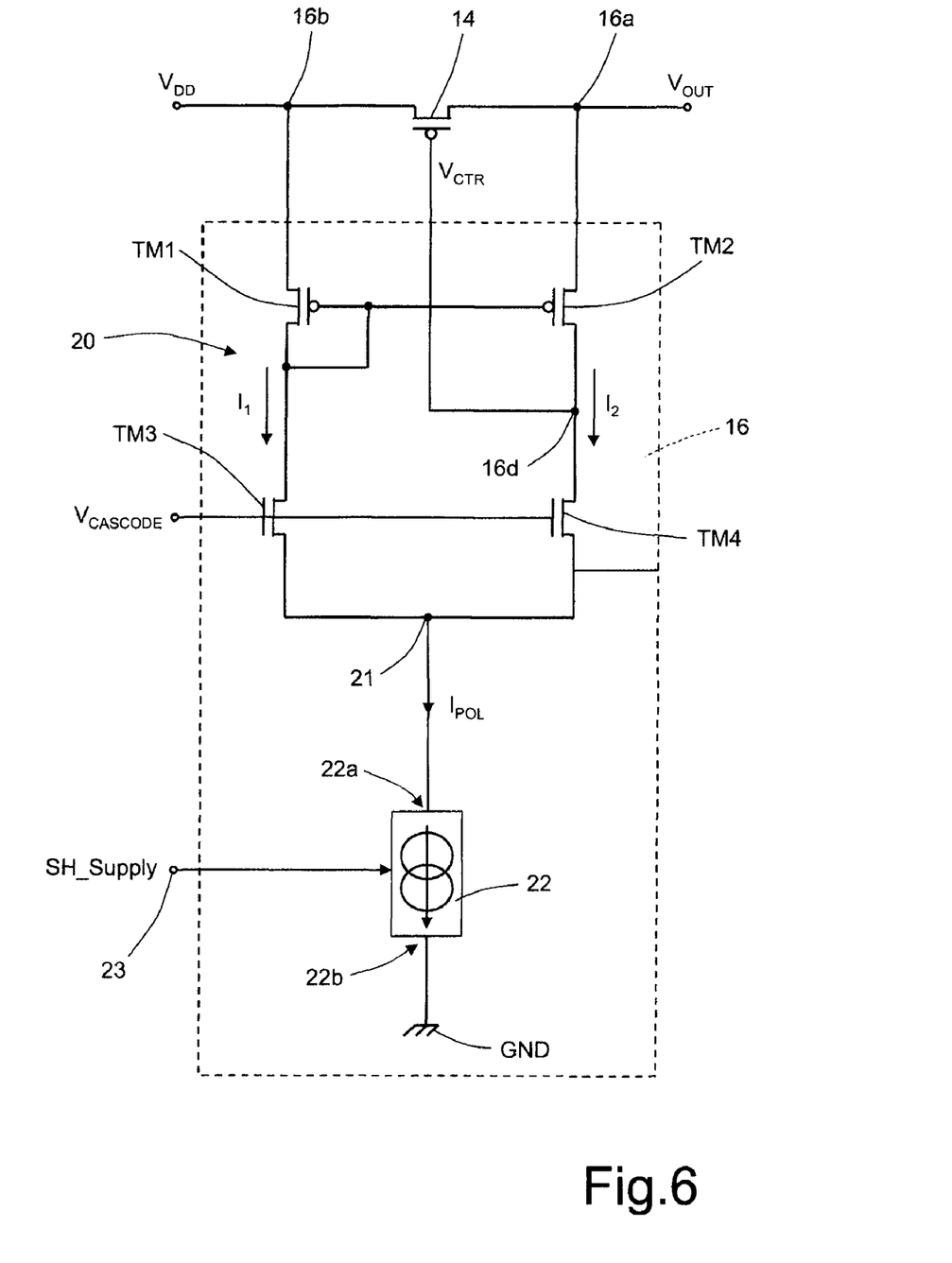
FIG. 6 shows a circuit representation of a voltage comparator present in the charge pump stage of FIG. 3 for optimization of the current-consumption levels.

FIG. 6 shows one embodiment of a control block 16.

The control block 16 comprises a comparator circuit 20 configured to compare the output voltage $V_{OUT}$ and the supply voltage $V_{DD}$ and supplying at output, as result of said comparison, the control signal $V_{CTR}$, configured to drive the switch 14 in conduction or inhibition.

The comparator circuit 20 comprises a first transistor TM1 of a pMOS type, and a second transistor TM2, also of a pMOS type, in current-mirror configuration, i.e., with the respective control terminals connected together. The source terminal of the first transistor TM1 is coupled to the supply terminal 3, biased at the supply voltage $V_{DD}$, and forms a first input terminal of the comparator circuit 20.

The source terminal of the second transistor TM2 is coupled to the output 2b of the charge pump 2, biased at the output voltage $V_{OUT}$. In addition, the source terminal of the first transistor TM1 and the source terminal of the second transistor TM2 are coupled together through the switch 14. The drain terminal of the second transistor TM2 is coupled to the control terminal of the pMOS transistor that provides the switch 14, whilst the drain terminal of the first transistor TM1 is coupled to the control terminal of the first and second transistors TM1, TM2.

The comparator circuit 20 further comprises a third transistor TM3, of an nMOS type, and a fourth transistor TM4, of an nMOS type. The third transistor TM3 and the fourth transistor TM4 have respective control terminals coupled together and biased at a voltage $V_{CASCODE}$ (generated, for example, externally to the control block 16) such as to bias the third and fourth transistors TM3, TM4 in saturation. In addition, the third transistor TM3 has a drain terminal of its own coupled to the drain terminal of the first transistor TM1, whilst the fourth transistor TM4 has a drain terminal of its own coupled to the drain terminal of the second transistor TM2. Respective source terminals of the third and fourth transistors TM3, TM4 are coupled together and to a first conduction terminal 22a of a current-generator circuit 22, forming a supply input 21 of the comparator circuit 20. The current-generator circuit further comprises a second conduction terminal 22b, coupled to a ground terminal GND.

In an embodiment, the first and second transistors TM1, TM2 are the same as one another; i.e., the respective gate areas have the same W/L ratio (where W is the gate width and L is the gate length). At the same time, also the third and fourth transistors TM3, TM4 are the same as one another; i.e., the respective gate areas have the same W/L ratio (possibly different from the W/L ratio of the first and second transistors TM1, TM2). In this way, the voltage $V_{CASCODE}$ applied to the control terminals of the third and fourth transistors generates currents I1 and I2 through the third and fourth transistors TM3, TM4 that are substantially the same as one another. To reduce the current consumption, the W/L ratio of the third and fourth transistors TM3, TM4 may be low.

In use, the comparator circuit 20 operates as a differential amplifier, comparing the voltages present on the source terminals of the first and second transistors TM1, TM2, i.e., the supply voltage $V_{DD}$ and the output voltage $V_{OUT}$. When the output voltage $V_{OUT}$ is lower than or equal to the supply voltage $V_{DD}$, the control signal $V_{CTR}$ present on the drain terminal of the second transistor TM2 assumes the low logic value "0" and drives the switch 14 in conduction.

When, instead, the voltage $V_{DD}$ drops below the regulation voltage $V_{REG}$, the output voltage $V_{OUT}$ does not drop immediately below the regulation voltage $V_{REG}$, in so far as the capacitances present on the output of the charge pump 2 (generated by one or more accumulation capacitors, which are not shown since they are internal to the charge pump 2 and integrating parts thereof) temporarily maintain the value of the output voltage $V_{OUT}$ at the voltage value that is set up across said accumulation capacitor or capacitors (the accumulation capacitor may be configured in such a way that across it there will be set up a voltage close to the regulation voltage $V_{REG}$). In this way, an imbalance is generated between the supply voltage $V_{DD}$ and the output voltage $V_{OUT}$ such as to cause a current I2 higher than a current I1 that flows through the first transistor TM1 to flow through the second transistor TM2. As a consequence of this, since the first and second transistors TM1 and TM2 are connected in current-mirror configuration, the control signal $V_{CTR}$ increases until the value of the output voltage $V_{OUT}$ (high logic value "1") is reached, thus driving the switch 14 in inhibition.

The current-generator circuit 22, which generates a biasing current $I_{POL}$=I1+I2, is controlled in operation by means of a supply-control signal SH_supply, taken on a terminal 23.

Figure 7A:
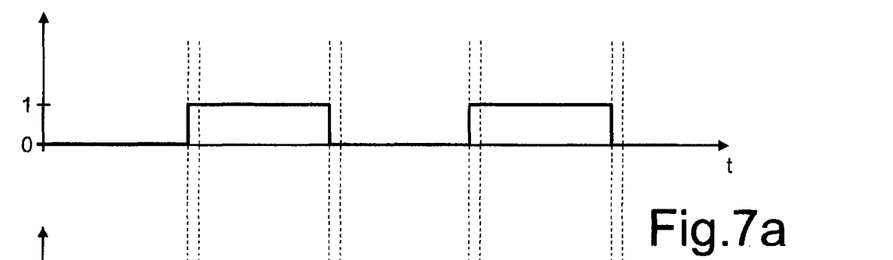
FIGS. 7a and 7b show, respectively, a clock signal and a digital signal obtained starting from the clock signal and used for optimizing the current consumption of the charge pump stage of FIG. 3 or FIG. 6.
Figure 7B:
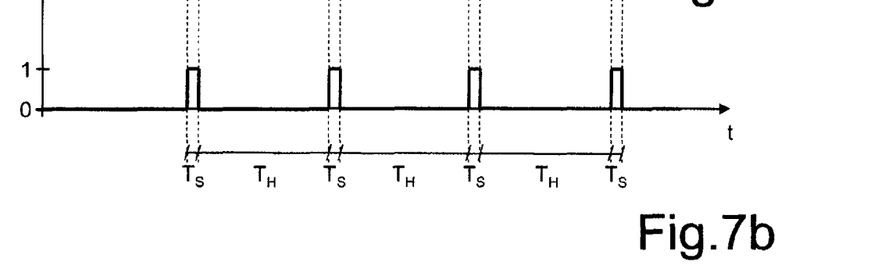

As shown in FIGS. 7a and 7b, the supply-control signal SH_supply of an embodiment is defined starting from a clock signal CLK having a frequency comprised between, for example, 500 kHz and 2 MHz, in an embodiment, of 500 kHz. The supply-control signal SH_supply comprises time intervals $T_S$ in which it is at a high logic level "1" alternating with time intervals $T_H$, in which it is at a low logic level "0". In greater detail, the logic level "1" of the supply-control signal SH_supply is activated by each rising edge and falling edge of the clock signal CLK.

Figure 8:
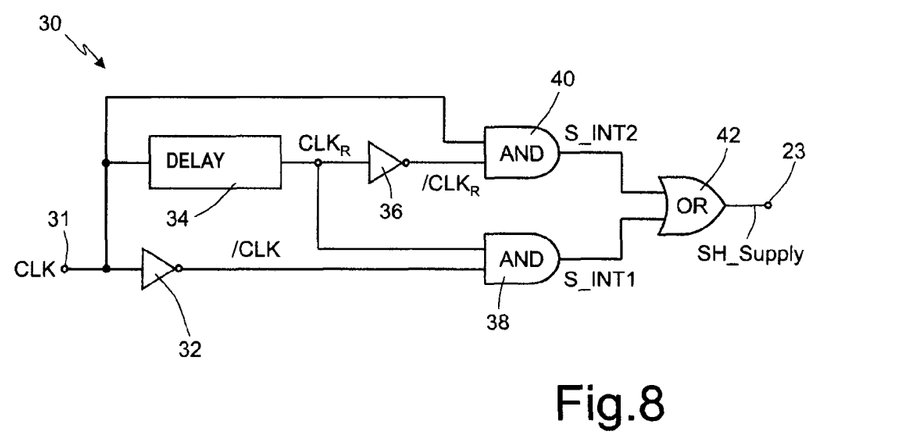

The supply-control signal SH_supply can be generated starting from the clock signal CLK using an activation-signal generator circuit 30, for example integrated in the control block 16, such as of the type shown in FIG. 8.

Figure 9A:
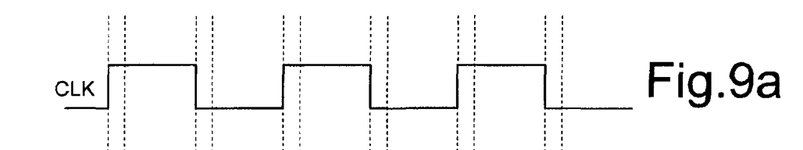
Figure 9B:
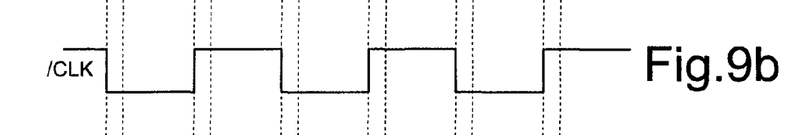
Figure 9C:
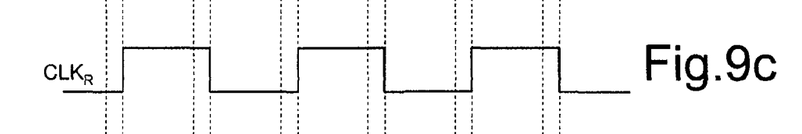
Figure 9D:
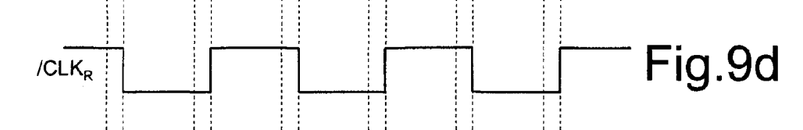

The activation-signal generator circuit 30 comprises an input terminal 31 (coupled to or corresponding to the third input terminal 16c of the control block 16), configured to receive the clock signal CLK, for example a clock signal CLK of the type shown in FIG. 9a, having a duty-cycle of 50% and a frequency of 500 kHz. The clock signal CLK is then supplied at input to an inverter 32, which generates on an output thereof an inverted clock signal /CLK (shown in FIG. 9b). At the same time, the clock signal CLK is also supplied at input to a delay block 34, configured for generating at output a delayed clock signal $CLK_R$ (FIG. 9c), for example delayed by 30 ns with respect to the clock signal CLK. The delayed clock signal $CLK_R$ is then supplied at input to an inverter 36, which generates at output an inverted delayed clock signal $/CLK_R$ (FIG. 9d).

Figure 9E:
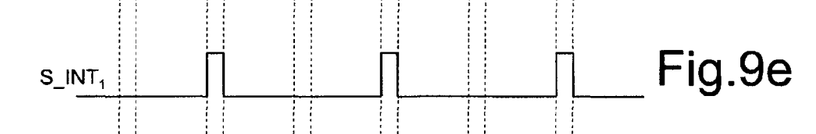
Figure 9F:
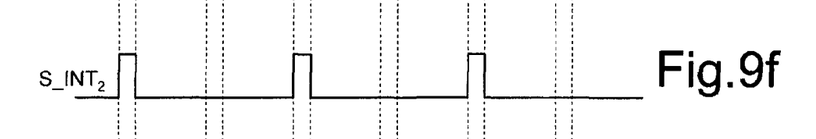
Figure 9G:
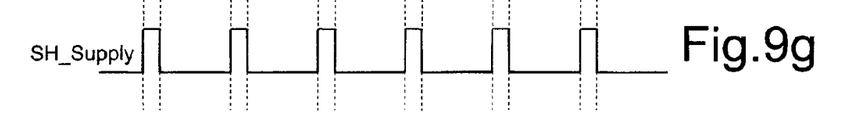

The delayed clock signal $CLK_R$ is also supplied at input to a first AND logic block 38, together with the negated clock signal /CLK. The AND logic block 38 receives on a first input the delayed clock signal $CLK_R$ and on a second input the negated clock signal /CLK; it then carries out an AND logic operation and supplies at output a first intermediate signal S_INT1, having a high logic value "1" when both of the signals $CLK_R$ and /CLK have a high logic value "1" (FIG. 9e). The activation-signal generator circuit 30 further comprises a second AND logic block 40, configured for receiving on a first input the clock signal CLK and on a second input the inverted delayed clock signal $/CLK_R$, then carrying out an AND logic operation, and supplying at output a second intermediate signal S_INT2, having a high logic value "1" when both of the signals CLK and $/CLK_R$ assume a high logic value "1" (FIG. 9f). The activation-signal generator circuit 30 comprises a logic block 42, having a first input configured for receiving the first intermediate signal S_INT1 and a second input configured for receiving the second intermediate signal S_INT2. The output of the logic block 42 is the supply-control signal SH_supply, having a high logic value "1" when at least one between the first intermediate signal S_INT1 and the second intermediate signal S_INT2 has a high logic value "1", and the low logic value "0" otherwise (FIG. 9g). As may be noted from FIGS. 9a-9g, the supply-control signal SH_supply has a period equal to half of the period of the clock signal CLK and a duty-cycle shorter than the duty-cycle of the clock signal CLK, for example comprised between 1% and 10%, for example, 3%.

In use, when the supply-control signal SH_supply has a high logic value "1", the comparator circuit 20 is supplied; instead, when the supply-control signal SH_supply has the low logic value "0", the comparator circuit 20 is not supplied.

Considering, for example, a frequency of the clock signal CLK equal to 500 kHz (half-period equal to 1 μs), the comparator circuit 20 is supplied for a time interval $T_S$=30 ns every 1 μs (i.e., 30 ns every half-period of the clock signal CLK) and is not supplied for the remaining portion of the half-period of the clock signal CLK considered, i.e., for $T_H$=970 ns. The time interval $T_S$ during which the comparator circuit 20 is supplied has a duration such as to enable a supply sufficient to maintain the comparator circuit 20 operative also during the time interval $T_H$, with the advantage of reducing considerably the current consumption of the comparator circuit 20.

Figure 10:
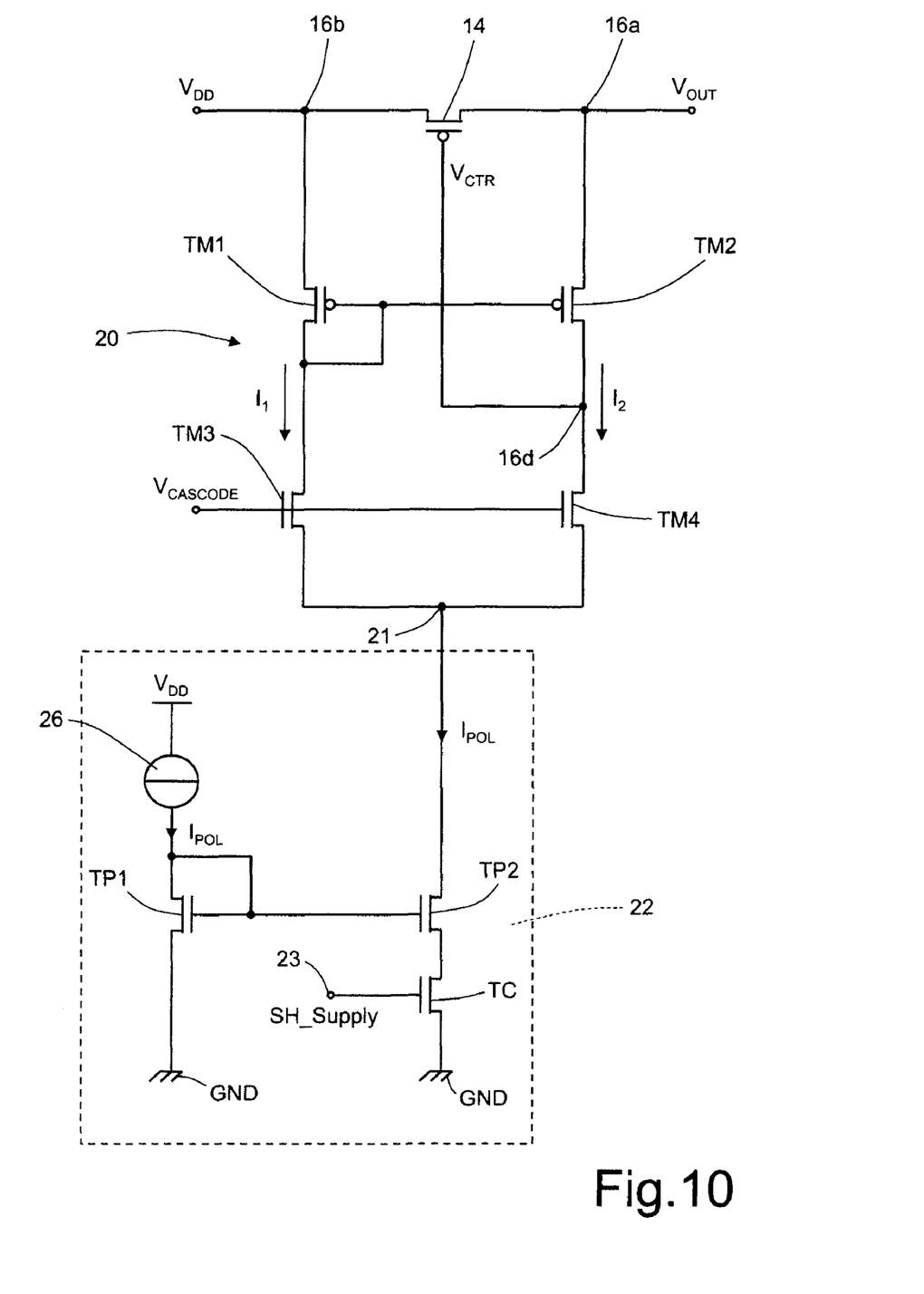
FIG. 10 shows a circuit representation of a current generator belonging to the charge pump stage of FIG. 3 or FIG. 6 and controlled, in use, by the digital signal of FIG. 7b.

FIG. 10 shows an embodiment of the current-generator circuit 22.

The current-generator circuit 22 comprises a current generator 26, for example, of a known type, coupled to a supply terminal (for example, as shown in the figure, to the supply terminal 3 biased at the voltage $V_{DD}$), and configured to generate the biasing current $I_{POL}$. The biasing current $I_{POL}$ flows towards a ground terminal GND through a first biasing transistor TP1, of an nMOS type, which is diode-connected, i.e., with the control terminal coupled to the drain terminal. The current-generator circuit 22 further comprises a second biasing transistor TP2, having a drain terminal coupled to the source terminals of the third and fourth transistors TM3, TM4 and a source terminal coupled to the ground terminal GND via a supply transistor TC. The first and second biasing transistors TP1, TP2 have the respective control terminals coupled together and form a current mirror.

The supply transistor TC is driven in conduction and inhibition via the supply-control signal SH_supply, supplied to the control terminal of the supply transistor. TC. In detail, the supply transistor TC is driven in conduction when the supply-control signal SH_supply is at a high logic level "1" (during the time interval $T_S$), coupling the source terminal of the second biasing transistor TP2 to the ground terminal GND, and is driven in inhibition when the supply-control signal SH_supply is at a low logic level "0" (during the time interval $T_H$), interrupting the connection between the source terminal of the second biasing transistor TP2 with the ground terminal GND. In this way, by driving the supply transistor TC alternatively in conduction and inhibition, it is possible to manage the supply to the control block 16 and, in particular, to the comparator circuit 20 effectively.

Figure 11:
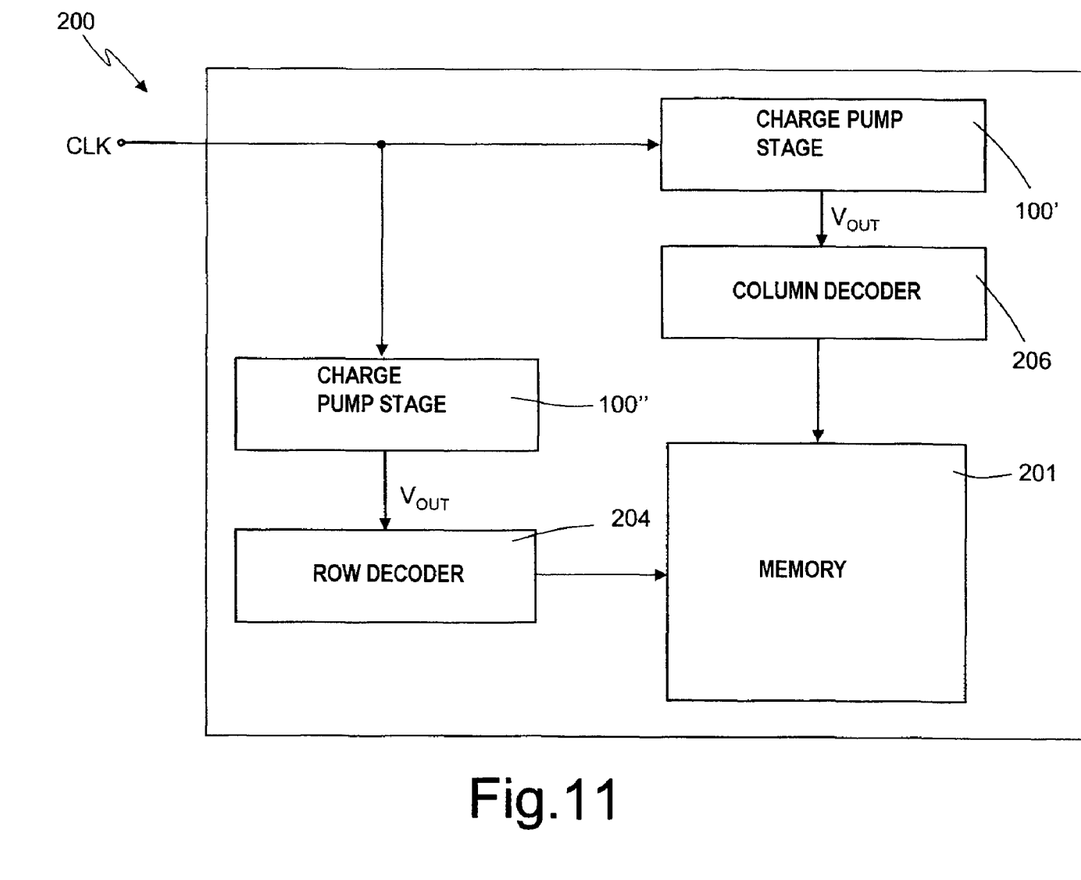
FIG. 11 shows a memory device comprising the charge pump stage of FIG. 3.

FIG. 11 shows a memory device 200 comprising a first charge pump stage 100' and a second charge pump stage 100" similar to the charge pump stage 100 of FIG. 3. The first charge pump stage 100' and the second charge pump stage 100" receive at input the clock signal CLK and supply at output a respective output signal $V_{OUT}$. In addition, the memory device 200 comprises a memory 201, for example an electrically erasable and programmable memory (EEPROM). The memory 201 may have an internal architecture of a known type, comprising an array of memory cells (not shown) connected together by means of wordlines, arranged to form rows of the array, and bitlines, arranged to form columns of the array. To access the memory 201 for reading operations, the memory device 200 comprises a row decoder 204, configured to receive at input the output signal $V_{OUT}$ generated by the second charge pump stage 100", and a column decoder 206, configured to receive at input the output signal $V_{OUT}$ generated by the first charge pump stage 100'. The first charge pump stage 100' is hence connected to the cells of the memory 201 through the interposition of the column decoder 206, whilst the second charge pump stage 100" is connected to the cells of the memory 201 through the interposition of the row decoder 204.

From an examination of the characteristics provided according to the description of the disclosure, the advantages an embodiment affords are evident.

For example, embodiments may provide a drastic reduction in the levels of consumption of the charge pump circuit 12 and of the control block 16. The charge pump 2 operates when necessary, i.e., when the output voltage $V_{OUT}$ is higher than the supply voltage $V_{DD}$ furnished by the supply terminal 3, remaining instead off when the supply voltage $V_{DD}$ is higher than or equal to the output voltage $V_{OUT}$ desired. In addition, since the control block 16 is not supplied continuously, but at pre-defined time intervals, the current consumption of said control block 16 is considerably reduced.

Furthermore, in an embodiment the charge pump may be advantageously controlled in switching-on/switching-off without the need for one or more signals for enabling and/or switching off the charge pump 2, generated externally.

It is clear that modifications and variations may be made to the regulator circuit described and illustrated herein.

For example, the switch 14 can be formed in an embodiment using a transistor of an nMOS type. In this case, the second transistor TM2 may have its own control terminal connected to its own drain terminal, and the control terminal and drain terminal of the first transistor TM1 may not be connected. According to this configuration, the control signal $V_{CTR}$ assumes the low logic value "0" (opening the switch 14) when the supply voltage $V_{DD}$ is lower than the output voltage $V_{OUT}$ and the high logic value "1" (closing the switch 14) when the supply voltage $V_{DD}$ is higher than the output voltage $V_{OUT}$.

In addition, in an embodiment the first and second transistors TM1, TM2 and the third and fourth transistors TM3, TM4, respectively, can have a W/L ratio of the respective gate areas different from one another, but proportional. For instance, the second transistor TM2 can have a W/L ratio N times that of the first transistor TM1. At the same time, also the fourth transistor TM4 has a W/L ratio N times that of the third transistor TM3. In this case, the currents I1 and I2 are not equal to one another, but proportional.

The various embodiments described above can be combined to provide further embodiments. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A charge pump comprising:
a supply terminal configured to receive a supply voltage and an output terminal configured to supply an output voltage;
a control block, including:
a comparator having a first comparison input configured to receive a first voltage correlated to the supply voltage, a second comparison input configured to receive a second voltage correlated to the output voltage, and a comparison output configured to output a pump-switch-off signal based on a comparison between the first voltage and the second voltage; and
a duty-cycle block configured to periodically activate the comparator during operation of the control block based on a plurality of pulses; and
a switch configured to switch off the charge pump based on the pump-switch-off signal.

2. The charge pump of claim 1 wherein the control block further comprises an activation-signal generator, configured to receive a clock signal and to generate the plurality of pulses based on the clock signal.

3. The charge pump of claim 1 wherein the comparator has a supply input, and the duty-cycle block has a current generator coupled to the supply input and the duty-cycle block is configured to receive the plurality of pulses and, based on the received plurality of pulses, to supply the comparator in a discontinuous way.

4. The charge pump of claim 3 wherein the duty-cycle block comprises a control switch having a first conduction terminal coupled to the comparator of the control block and a second conduction terminal coupled to a reference potential terminal, the control switch being configured to operate alternatively in a ON state and in a OFF state in response to the plurality of pulses.

5. The charge pump of claim 4 wherein the plurality of pulses are a signal of a periodic digital type having a first logic value in a first time interval in which the control switch is in an ON state, and a second logic value in a second time interval in which the control switch is in an OFF state.

6. The charge pump of claim 3 wherein the duty-cycle block comprises a biasing transistor, coupled between a first conduction terminal of a control switch and the comparator and configured to generate a biasing current.

7. The charge pump of claim 1 wherein the duty-cycle block is configured to maintain a duty-cycle of the comparator of less than 50%.

8. The charge pump of claim 7 wherein the duty-cycle block is configured to maintain a duty-cycle of the comparator of between 1% and 10%.

9. The charge pump of claim 1 wherein the control block comprises a current mirror having a first input and a second input, and a first output, the first input of the current mirror being coupled to the supply terminal, the second input of the current mirror being coupled to the output terminal, and the first output of the current mirror being coupled to the comparison output.

10. The charge pump of claim 9 wherein the current mirror comprises a first transistor and a second transistor having a respective first conduction terminal, a respective second conduction terminal, and a respective control terminal, said first conduction terminals forming, respectively, the first comparison input and the second comparison input of the control block, said control terminals of the first and second transistors being coupled to one another and to the second conduction terminal of one between the first and second transistors, wherein said control block comprises a first current source coupled to the second conduction terminal of the first transistor, and a second current source coupled to the conduction terminal of the second transistor, said duty-cycle block being coupled to the first output of the current mirror via the first current source and to a second output of the current mirror via the second current source.

11. The charge pump of claim 1 wherein the switch is a bypass switch, having a first conduction terminal coupled to the supply terminal, a second conduction terminal coupled to the output terminal and a control terminal coupled to the comparison output and configured to receive the pump-switch-off signal.

12. The charge pump of claim 1 wherein the switch is configured to short-circuit the charge pump based on the pump-switch-off signal.

13. A memory comprising:
a memory block; and
a charge pump, the charge pump being configured to provide an output voltage to the memory block and including:
   a comparator configured to compare a first voltage correlated to a supply voltage to a second voltage correlated to the output voltage;
   a duty-cycle block configured to periodically activate the comparator during operation of the memory block based on a plurality of pulses; and
   an activation-signal generator configured to receive a clock signal and to generate the plurality of pulses based on the clock signal.

14. The memory of claim 13 wherein the plurality of pulses are a signal of a periodic digital type having a first logic value in a first time interval and a second logic value in a second time interval.

15. The memory of claim 13 wherein the duty-cycle block is configured to maintain a duty-cycle of the comparator of between 1% and 10%.

16. The memory of claim 13 wherein the comparator comprises a current mirror having a first input and a second input, and a first output, the first input of the current mirror being coupled to the supply voltage, the second input of the current mirror being coupled to the output voltage, and the first output of the current mirror being coupled to an output of the comparator.

17. The memory of claim 16 wherein the current mirror comprises a first transistor and a second transistor having a respective first conduction terminal, a respective second conduction terminal, and a respective control terminal, said first conduction terminals forming, respectively, a first comparison input and a second comparison input of the comparator, said control terminals of the first and second transistors being coupled to one another and to the second conduction terminal of one between the first and second transistors, wherein said comparator comprises a first current source coupled to the second conduction terminal of the first transistor, and a second current source coupled to the conduction terminal of the second transistor, said duty-cycle block being coupled to a first output of the current mirror via the first current source and to a second output of the current mirror via the second current source.

18. A memory comprising:
a memory block; and
a charge pump, the charge pump being configured to provide an output voltage to the memory block and including:
   a comparator configured to compare a first voltage correlated to a supply voltage to a second voltage correlated to the output voltage; and
   a duty-cycle block configured to periodically activate the comparator during operation of the memory block based on a plurality of pulses, the duty-cycle block including a current generator coupled to a supply input of the comparator and configured to generate a biasing current.

19. A memory comprising:
a memory block; and
a charge pump, the charge pump being configured to provide an output voltage to the memory block and including:
   a comparator configured to compare a first voltage correlated to a supply voltage to a second voltage correlated to the output voltage;
   a duty-cycle block configured to periodically activate the comparator during operation of the memory block based on a plurality of pulses; and
   a bypass switch coupled between the supply voltage and an output of the charge pump, wherein the comparator is configured to control the bypass switch.

20. The memory of claim 19 wherein the charge pump further comprises an activation-signal generator configured to receive a clock signal and to generate the plurality of pulses based on the clock signal.

21. A method, comprising:
providing a supply voltage to a charge pump configured to provide an output voltage;
in response to a plurality of pulses, periodically comparing a first voltage correlated to the supply voltage to a second voltage correlated to the output voltage of the charge pump;
generating a charge-pump control signal based on the comparing; and
providing a biasing current to a comparator, wherein the periodically comparing comprises interrupting the biasing current in response to the plurality of pulses.

22. The method of claim 21 wherein the periodically comparing comprises supplying a comparator in a discontinuous way.

23. The method of claim 22 wherein the plurality of pulses are pulses of an activation signal having, during a first time interval, a first logic value for supply of the comparator and, during a second time interval, a second logic value for supply interruption of the comparator.

24. The method of claim 23 wherein the activation signal has a duty-cycle of less than 50%.

25. The method claim 23 wherein the activation signal has a duty-cycle between 1% and 10%.

26. The method of claim 21, further comprising generating the plurality of pulses.

27. A system, comprising:
means for generating an output voltage from a supply voltage;
means for responding to a plurality of pulses by periodically comparing a first voltage correlated to the supply voltage to a second voltage correlated to the output voltage;
means for controlling the means for generating coupled to the means for periodically comparing, wherein the controlling is based on the periodic comparing; and
means for providing a biasing current to the means for periodically comparing, wherein the means for providing a biasing current is configured to periodically supply the biasing current based on the plurality of pulses.

28. The system of claim 27, further comprising:
means for storing data coupled to the means for generating.

29. The system of claim 27 wherein the means for periodically comparing comprises:
a current mirror including a first transistor and a second transistor having a respective first conduction terminal, a respective second conduction terminal, and a respective control terminal, said first conduction terminals forming, respectively, a first comparison input and a second comparison input, said control terminals of the first and second transistors being coupled to one another and to the second conduction terminal of one between the first and second transistors;
a first current source coupled to the second conduction terminal of the first transistor, and a second current source coupled to the conduction terminal of the second transistor; and
a duty-cycle block coupled to a first output of the current mirror via the first current source and to a second output of the current mirror via the second current source.

30. A system, comprising:
means for generating an output voltage from a supply voltage;
means for responding to a plurality of pulses by periodically comparing a first voltage correlated to the supply voltage to a second voltage correlated to the output voltage;
means for controlling the means for generating coupled to the means for periodically comparing, wherein the controlling is based on the periodic comparing; and
means for bypassing the means for generating coupled to the means for controlling.

31. The system of claim 30, comprising means for providing a biasing current to the means for periodically comparing, wherein the means for providing a biasing current is configured to periodically supply the biasing current based on the plurality of pulses.

32. The system of claim 31, further comprising means for generating the plurality of pulses.

33. A memory comprising:
a memory block; and
a charge pump, the charge pump being configured to provide an output voltage to the memory block and including:
a comparator configured to compare a first voltage correlated to a supply voltage to a second voltage correlated to the output voltage; and
a duty-cycle block configured to periodically activate the comparator during operation of the memory block based on a plurality of pulses, wherein an output of the comparator is coupled to a bypass switch configured to power-off at least part of the charge pump based on the output of the comparator.

34. A method, comprising:
providing a supply voltage to a charge pump configured to provide an output voltage;
in response to a plurality of pulses, periodically comparing a first voltage correlated to the supply voltage to a second voltage correlated to the output voltage of the charge pump;
generating a charge-pump control signal based on the comparing; and
powering-off the charge-pump based on the control signal.

35. The method of claim 34, further comprising providing a biasing current to a comparator, wherein the periodically comparing comprises interrupting the biasing current in response to the plurality of pulses.

* * * * *